United States Patent
Oh et al.

(10) Patent No.: US 12,060,942 B2
(45) Date of Patent: Aug. 13, 2024

(54) SEALING MEMBER AND APPARATUS FOR TREATING SUBSTRATE

(71) Applicant: SEMES CO., LTD., Cheonan-si (KR)

(72) Inventors: Seung Hoon Oh, Cheonan-si (KR); Sang Min Lee, Seoul (KR); Jong Doo Lee, Gyeongju-si (KR); Jin Mo Jae, Asan-si (KR); Young Hun Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 33 days.

(21) Appl. No.: 17/544,950

(22) Filed: Dec. 8, 2021

(65) Prior Publication Data

US 2022/0178446 A1 Jun. 9, 2022

(30) Foreign Application Priority Data

Dec. 8, 2020 (KR) .................. 10-2020-0169995

(51) Int. Cl.
*F16J 15/3204* (2016.01)
*B08B 7/00* (2006.01)

(52) U.S. Cl.
CPC ......... *F16J 15/3204* (2013.01); *B08B 7/0021* (2013.01)

(58) Field of Classification Search
CPC ......... H01L 21/02041; H01L 21/02043; H01L 21/02052; H01L 21/02054; H01L 21/02101; H01L 21/67017; H01L 21/67023; H01L 21/67028; H01L 21/67034; H01L 21/6704; H01L 21/67057; H01L 21/6719; F16L 19/0218; F16J 15/3204; B08B 7/0021
See application file for complete search history.

(56) References Cited

U.S. PATENT DOCUMENTS

| | | |
|---|---|---|
| 2013/0042765 A1 | 2/2013 | Chameroy et al. |
| 2015/0176897 A1 | 6/2015 | Jun |
| 2017/0159827 A1* | 6/2017 | Csoma .................. F16J 15/48 |
| 2019/0096717 A1 | 3/2019 | Lee et al. |
| 2020/0101501 A1 | 4/2020 | Lee et al. |
| 2020/0126821 A1 | 4/2020 | Lee et al. |

FOREIGN PATENT DOCUMENTS

| | | |
|---|---|---|
| JP | 4582816 | 9/2010 |
| KR | 1020090066046 | 6/2009 |
| KR | 10-2013-0042856 | 4/2013 |
| KR | 10-2015-0078606 | 7/2015 |

(Continued)

OTHER PUBLICATIONS

Office Action from Taiwan Intellectual Property Office dated May 16, 2022.

(Continued)

*Primary Examiner* — David G Cormier

(57) ABSTRACT

A sealing member for use in sealing a chamber for treating a substrate, the sealing member inserted in a groove formed in the chamber, includes a bottom part, a top part opposite the bottom part, an inner part connecting a first side of the bottom part to the top part, an outer part opposite the inner part and connecting a second side of the bottom part to the top part, and a recessed portion between the top part and the outer part.

9 Claims, 11 Drawing Sheets

(56) References Cited

FOREIGN PATENT DOCUMENTS

| | | |
|---|---|---|
| KR | 1020150073527 | 7/2015 |
| KR | 200491839 | 6/2020 |
| KR | 1020220060035 | 5/2022 |
| TW | 201250911 | 12/2012 |
| WO | 2006137370 | 12/2006 |

OTHER PUBLICATIONS

Notice of Allowance from the Korean Intellectual Property Office dated Apr. 23, 2024.

* cited by examiner

SEALING MEMBER AND APPARATUS FOR TREATING SUBSTRATE

CROSS-REFERENCE TO RELATED APPLICATIONS

A claim for priority under 35 U.S.C. § 119 is made to Korean Patent Application No. 10-2020-0169995 filed on Dec. 8, 2020, in the Korean Intellectual Property Office, the entire contents of which are hereby incorporated by reference.

BACKGROUND

Embodiments of the inventive concept described herein relate to a sealing member and an apparatus for treating a substrate.

Various processes such as a photolithography process, an etching process, an ashing process, an ion implantation process, and a thin film deposition process are carried out to manufacture a semiconductor device. At each of the processes, various treating liquids and treating gases are used and during a process, particles and process by-products are generated. A cleaning process is performed before and after each process to remove these particles and process by-products from the substrate.

In a conventional cleaning process, the substrate is treated with chemicals and a rinsing liquid before a drying treatment. As an example of the drying treatment, there is a rotating drying process that rotates the substrate at a high speed and removes the rinsing liquid remaining on the substrate. However, such a rotating drying method may tear down a pattern formed on the surface of the substrate.

Accordingly, recently a supercritical drying process, of supplying an organic solvent such as isopropyl alcohol (IPA) on the substrate to replace the rinsing liquid remaining on the substrate with an organic solvent having a low surface tension and then supplying a treating fluid in a supercritical state on the substrate to remove the organic solvent remaining on the substrate, is being used. In the supercritical drying process, a drying gas is supplied to a process chamber with a sealed inside, and the drying gas is heated and pressurized. Accordingly, both the temperature and pressure of the drying gas rise above the threshold point, and the drying gas phase-changes to the supercritical state.

A substrate treating apparatus 1 performing such a supercritical drying process includes a top chamber 2 and a bottom chamber 3, as shown in FIG. 1 and FIG. 2. The top chamber 2 and the bottom chamber 3 combine with each other to form a treating space in which the substrate such as a wafer is treated. In addition, any one of the top chamber 2 or the bottom chamber 3 (e.g., the bottom chamber 3) is configured to be movable in an up/down direction so that the substrate may be brought in and out of the treating space. In addition, in the supercritical drying process, it is important to keep a pressure of the treating space at a high pressure. Accordingly, the substrate treating apparatus 1 includes an O-ring 5 so as to improve an airtightness of the treating space formed by the top chamber 2 and the bottom chamber 3. A groove 4 into which the O-ring 5 is fitted is formed in the bottom chamber 3. In addition, when viewed from a cross-section, the O-ring 5 has a circular shape. The groove 4 includes a bottom surface 4c, one side 4a, and the other side 4b.

A typical O-ring is fixed in a compressed state after being mounted. Alternatively, the O-ring 5 fitted into the groove 4 of the bottom chamber 3 repeatedly contacts the top chamber 2 while the bottom chamber 3 is moved in the up/down direction. That is, the shape of the O-ring 5 placed in the driving environment is repeatedly deformed between the compressed state and the non-compressed state. In addition, while the O-ring 5 is repeatedly deformed between the compressed and non-compressed states, a surface of the O-ring 5 repeatedly contacts one side 4a and the other side 4b of the groove 4 as shown in FIG. 3. Accordingly, the surface of the O-ring 5 becomes worn. In addition, as described above, the O-ring 5 has a circular shape when viewed from the cross-section. Therefore, the O-ring 5 line-contacts the side 4a and the other side 4b of the groove 4. Thus, the area in which the O-ring 5 contacts the side 4a and the other side 4b is small. Accordingly, the surface of the O-ring 5 becomes more easily worn. When the O-ring 5 is worn, a gap appears in the O-ring 5 inserted into the groove 4, which causes particles and makes it difficult to maintain the airtightness of the treating space defined by the top chamber 2 and the bottom chamber 3.

SUMMARY

Embodiments of the inventive concept provide a sealing member and a substrate treating apparatus for efficiently treating a substrate.

Embodiments of the inventive concept provide a sealing member and a substrate treating apparatus for minimizing an occurrence of process by-products such as particles when the substrate is brought into the treating space or when the substrate is brought out form the treating space.

Embodiments of the inventive concept provide a sealing member and a substrate treating apparatus for minimizing an occurrence of abrasion of the sealing member which is continually deformed in shape due to a repetition between a compressed state and a decompressed state.

The technical objectives of the inventive concept are not limited to the above-mentioned ones, and the other unmentioned technical objects will become apparent to those skilled in the art from the following description.

According to an embodiment of the present invention, a sealing member for use in sealing a chamber for treating a substrate, the sealing member inserted in a groove formed in the chamber, includes a bottom part, a top part opposite the bottom part, an inner part connecting a first side of the bottom part to the top part, an outer part opposite the inner part and connecting a second side of the bottom part to the top part, and a recessed portion between the top part and the outer part.

According to an embodiment of the present invention, a substrate treating apparatus includes a first body, a second body combining with the first body to form a treating space for treating a substrate, a moving member moving at least one of the first body and the second body, and a sealing member inserted in a groove at the first body or the second body. The sealing member when seen from a cross-section of the sealing member includes a bottom part, a top part, an inner part formed between the bottom part and the top part and positioned adjacent to the treating space, and an outer part formed between the bottom part and the top part and positioned further away from the treating space than the inner part. A surface of the outer part has an inclined shape with respect to a bottom surface of the groove and is polished to have a surface roughness that is lower than a surface roughness of each of the other parts of the sealing member.

According to an embodiment of the present invention, a substrate treating apparatus, using a supercritical fluid to treat a substrate, includes a top body, a bottom body combining with the top body to form a treating space for treating the substrate, a moving member moving the bottom body upwardly or downwardly, and a sealing member inserted in a groove formed at the bottom body. The sealing member includes a bottom part, a top part, an inner part connecting a first side of the bottom part to the top part, an outer part opposite the inner part and connecting a second side of the bottom part to the top part, and having an inclined shape with respect to a bottom surface of the groove, and a recessed portion between the outer part and the top part. The groove includes the bottom surface on which the bottom part is placed, an inner surface facing a surface of the inner part, and an outer surface facing a surface of the outer part. The outer surface is polished to have a surface roughness lower than a surface roughness of each of the bottom part, the top part, and the inner part.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
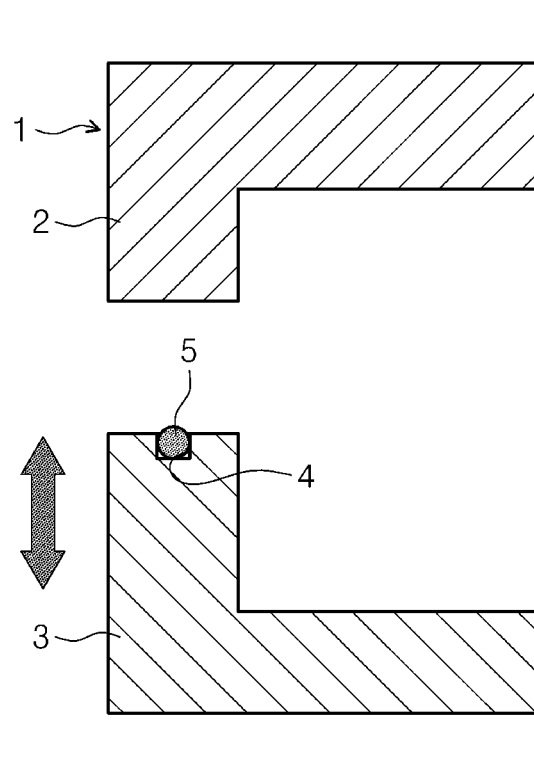
FIG. 1 is a view illustrating a conventional substrate treating apparatus.
Figure 2:
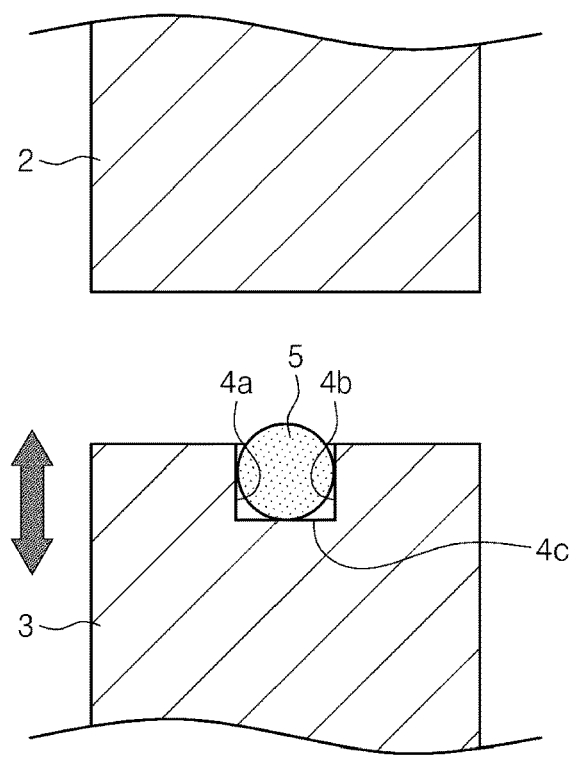
FIG. 2 is a view of a sealing member provided at a bottom chamber of the substrate treating apparatus of FIG. 1.
Figure 3:
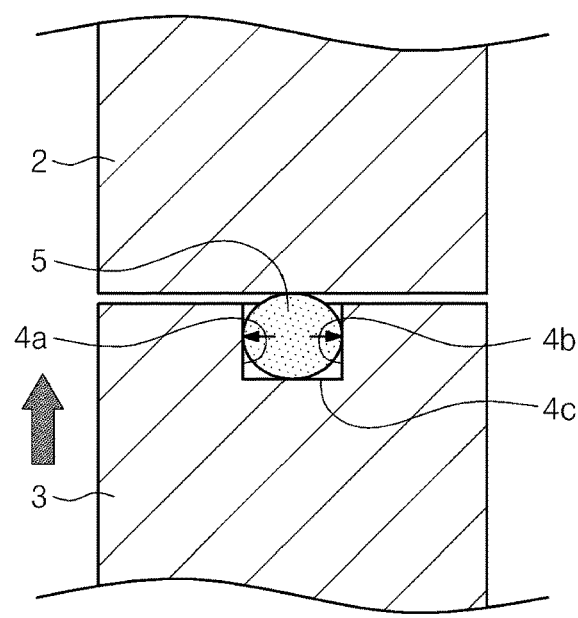
FIG. 3 is a view of the sealing member of FIG. 2 compressed by a top chamber.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Singular expressions include plural expressions unless they explicitly have a different meaning in the context. In addition, the shape and size of the elements in the drawings may be exaggerated for clearer explanation.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or component is referred to as being "on", "connected to", "coupled to", or "adjacent to" another element or component, it can be directly on, connected, coupled, or adjacent to the other element or component, or intervening elements or components may be present. In contrast, when an element is referred to as being "directly on," "directly connected to", "directly coupled to", or "immediately adjacent to" another element or component, there are no intervening elements or components present. Other expression explaining the relationship between elements such as when an element is referred to as being "between" another two elements, it can be directly between another two elements or indirectly between another two elements.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, embodiments of the inventive concept will be described in detail with reference to FIG. 4 to FIG. 13.

Figure 4:
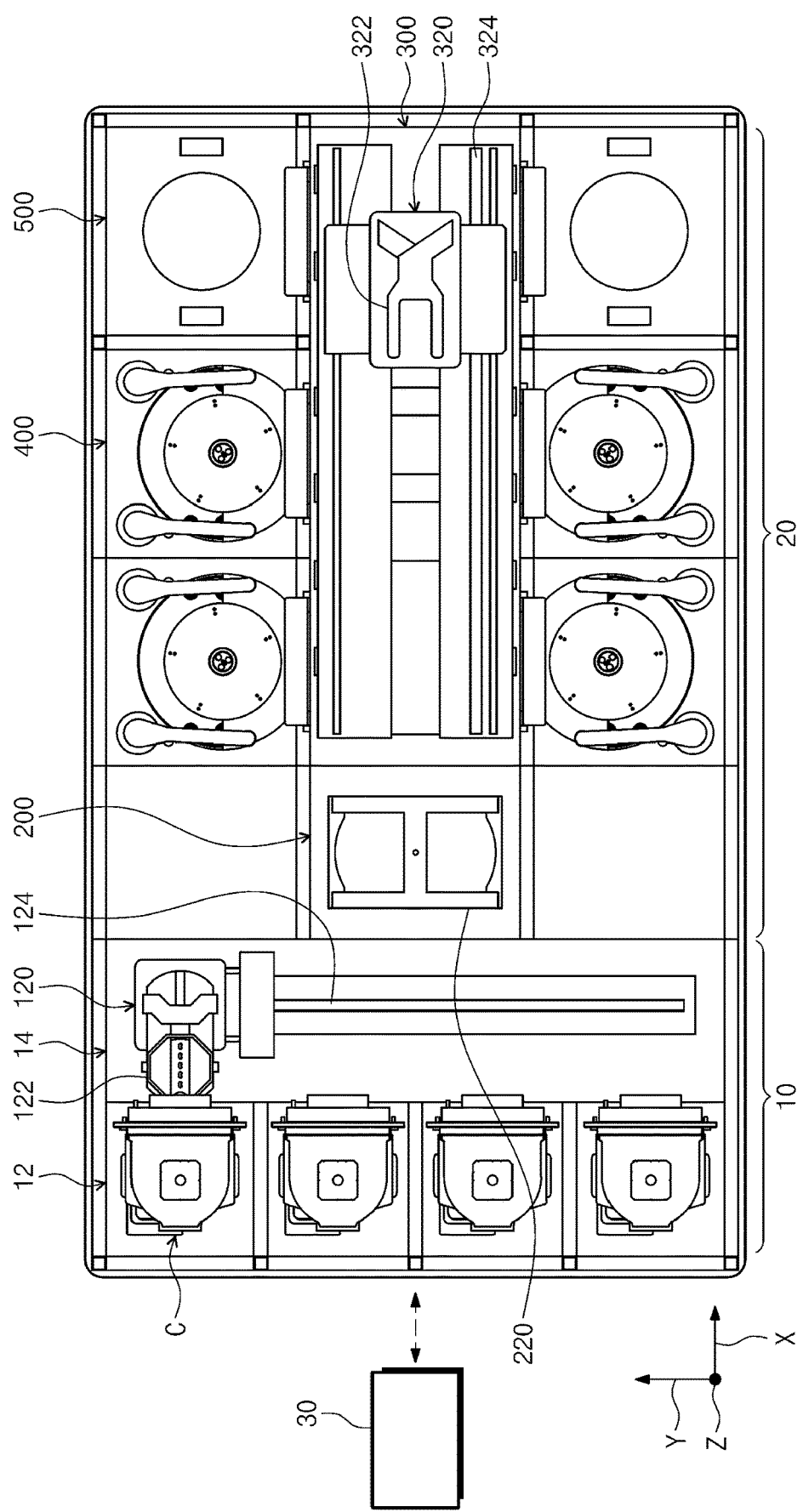
FIG. 4 is a view illustrating the substrate treating apparatus according to an embodiment of the inventive concept.

FIG. 4 illustrates a substrate treating apparatus according to an embodiment of the inventive concept. The substrate treating apparatus comprises an index module 10, a treating module 20, and a controller 30. When viewed from above, the index module 10 and the treating module 20, are sequentially arranged in a row. Hereinafter, a direction in which the index module 10 and the treating module 20 are arranged will be referred to as a first direction X, a direction that is perpendicular to the first direction X when viewed from above will be referred to as a second direction Y, and a direction that is perpendicular to both the first direction X and the second direction Y will be referred to as a third direction Z.

The index module 10 transfers the substrate W from the container C in which the substrate W is stored to the treating module 20, and the treating module 20 gets the treated substrate W to be stored in the container C. The index module 10 is provided with its length extending along the second direction Y. The index module 10 has a load port 12 and an index frame 14. The index frame 14 is placed between the load port 12 and the treating module 20. The container C in which the substrates W are stored is placed at the load port 12. A plurality of load ports 12 may be provided, and the plurality of load ports 12 may be placed along the second direction Y.

For the container C, a closing-type container C such as a front open unified pod (FOUP) can be used. The container C can be placed on the load port 12 by a transfer means (not shown) such as an overhead transfer, an overhead conveyor, or an automatic guided vehicle, or the container C may be placed on the load port 12 by an operator.

An index robot 120 is provided inside the index frame 14. In the index frame 14, a guide rail 124 is provided with its length extending along the second direction Y, and the index robot 120 may be provided movable on the guide rail 124. The index robot 120 includes a hand 122 on which the substrate W is placed, and the hand 122 may be provided to be forwardly and backwardly movable, rotatable with the third direction Z as an axis, and movable along the third direction Z. A hand 122 may be provided in a plurality and placed apart in an up/down direction, and the hands may be provided to be independently forwardly and backwardly movable, respectively.

The controller 30 may control the substrate treating apparatus. The controller 30 may comprise a process controller consisting of a microprocessor (computer) that executes control of the substrate treating apparatus, a user interface such as a keyboard via which an operator inputs commands to manage the substrate treating apparatus and/or a display showing the operating situation of the substrate treating apparatus, and a memory unit storing a treating recipe, i.e., a control program to execute treating processes of the substrate treating apparatus by controlling the process controller or a program to execute components of the substrate treating apparatus according to data and treating condition. In addition, the user interface and the memory unit may be connected to the process controller. The treating recipe may be stored in a storage medium of the storage unit, and the storage medium may be a hard disk, a portable disk such as a CD-ROM, a DVD, or a semiconductor memory such as a flash memory.

The treating module 20 includes a buffer unit 200, a transfer chamber 300, a liquid treating chamber 400 (i.e., a liquid treatment chamber), and a drying chamber 500. The buffer unit 200 provides a space in which the substrate W carried into the treating module 20 and the substrate W carried out from the treating module 20 temporarily stay. The liquid treating chamber 400 supplies a liquid onto the substrate W to perform a liquid treatment process of liquid treatment on the substrate W. The drying chamber 500 performs a drying process of removing a liquid remaining on the substrate W. The transfer chamber 300 transfers the substrate W between the buffer unit 200, the liquid treating chamber 400, and the drying chamber 500.

The transfer chamber 300 is provided with its length parallel to the first direction X. A buffer unit 200 is placed between the index module 10 and the transfer chamber 300.

A liquid treating chamber 400 and a drying chamber 500 is placed at a surface of the transfer chamber 300. The liquid treating chamber 400 and the transfer chamber 300 are placed along the second direction Y. The drying chamber 500 and the transfer chamber 300 are placed along the second direction Y. The buffer unit 200 is placed at an end of the transfer chamber 300.

According to an embodiment, liquid treating chambers 400 may be disposed on both sides of the transfer chamber 300, drying chambers 500 may be disposed on both sides of the transfer chamber 300, and liquid treating chambers 400 may be disposed closer to the buffer unit 200 than the drying chambers 500. At one surface of the transfer chamber 300, the liquid treating chambers 400 may be provided in an array of A×B (A and B are each natural numbers of 1 or greater), respectively, along the first direction X and the third direction Z. In addition, at one surface of the transfer chamber 300, each of the drying chambers 500 may be provided in C×D (C and D are each natural numbers of 1 or greater) respectively, along the first direction X and the third direction Z. Unlike the above description, only liquid treating chambers 400 may be provided at one surface of the transfer chamber 300, and only drying chambers 500 may be provided at the other side thereof.

The transfer chamber 300 has a transfer robot 320. In the transfer chamber 300 a guide rail 324 may be provided, the guide rail 324 having its lengthwise direction in the first direction X, and the transfer robot 320 may be provided to be movable on the guide rail 324. The transfer robot 320 may include a hand 322 on which the substrate W is placed, and the hand 322 may be provided to be forwardly and backwardly movable, rotatable with the third direction Z as an axis, and movable in the third direction Z. A plurality of hands 322 are provided to be spaced apart in the up/down direction, and the hands 322 may be forwardly and backwardly movable independently of each other.

The buffer unit 200 includes a plurality of buffers 220 on which the substrate W is placed. The buffers 220 may be disposed to be placed apart from each other in the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

Figure 5:
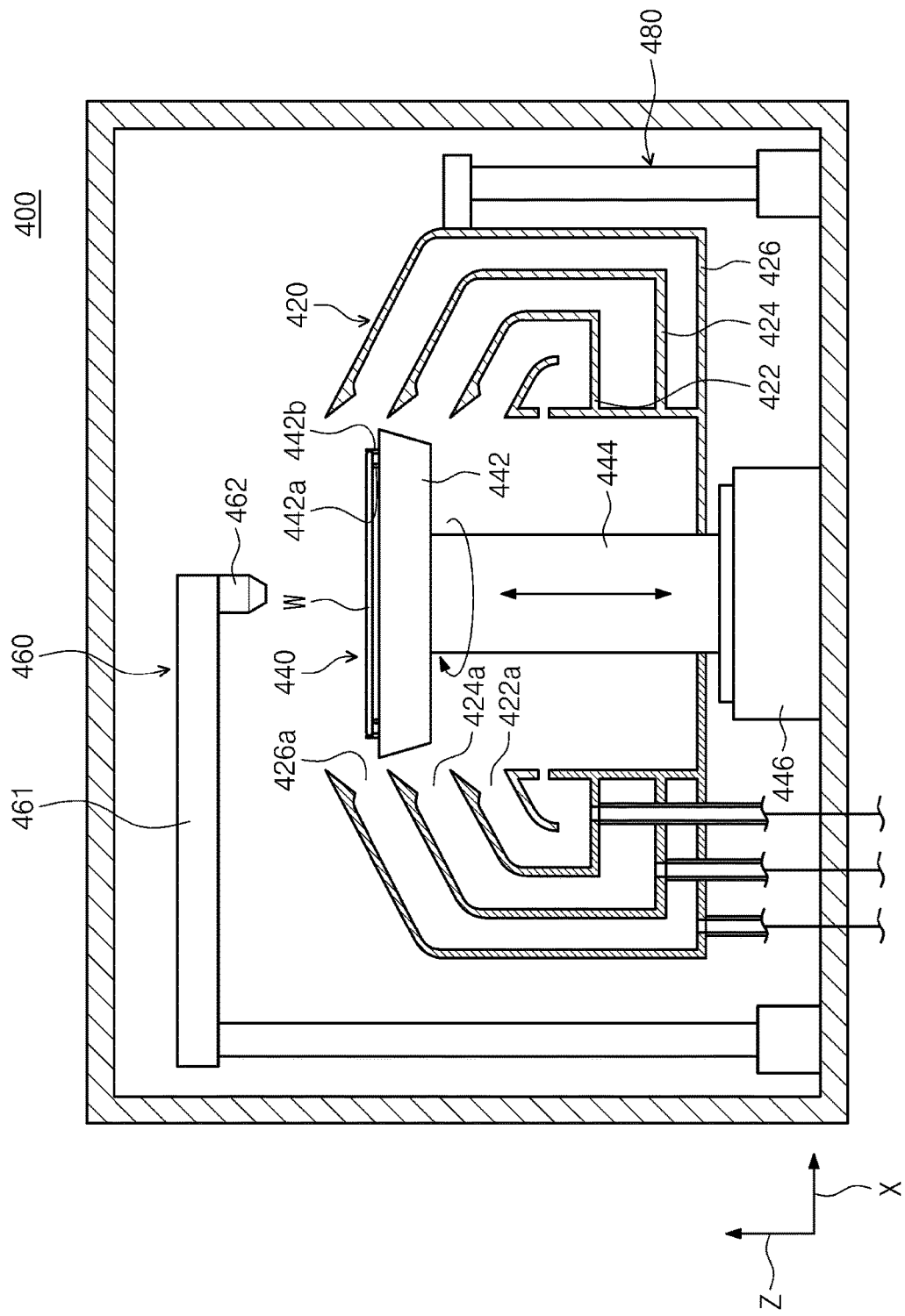
FIG. 5 is a view schematically illustrating an embodiment of a liquid treatment chamber of FIG. 4.

FIG. 5 schematically illustrates an embodiment of the liquid treatment chamber of FIG. 4. Referring to FIG. 5, the liquid treatment chamber 400 may include a housing 410, a cup 420, a support unit 440, a liquid supply unit 460, and a lifting/lowering unit 480.

The housing 410 may have an inner space for treating the substrate W. The housing 410 may be provided in a substantially hexahedron shape. For example, the housing 410 may have a rectangular parallelepiped shape. Also, an opening (not shown) may be formed in a sidewall of the housing 410. The opening may function as an entrance/exit opening through which the substrate W enters or exits the inner space. In addition, in order to selectively open or close the opening, a door (not shown) may be provided at the housing 410.

The cup 420 may have a reversed U-shape. The cup 420 may have a treating space, and the substrate W may be liquid treated in the treating space. The support unit 440 supports the substrate W in the treating space. The liquid supply unit 460 supplies treating liquid to the substrate supported by the support unit 440. The treating liquid may be provided in a plurality, and may be sequentially supplied to the substrate W. The lifting/lowering unit 480 may adjust the relative heights of the cup 420 and the support unit 440.

According to an embodiment, the cup 420 has a plurality of recollecting containers 422, 424, and 426. Each of the recollecting containers 422, 424, and 426 has a recollecting space for recollecting the liquid used for the substrate treatment. Each of the recollecting containers 422, 424, and 426 are provided in a ring shape surrounding the support unit 440. During the liquid treatment process, the treating liquid scattered by the rotation of the substrate W is introduced into the recollecting space through inlets 422a, 424a, and 426a of each recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing a liquid into the second recollecting container 424 may be located above the first inlet 422a introducing the liquid into the first recollecting container 422, and the third inlet 426a introducing the liquid into the third recollecting container 426 may be located above the second inlet 424a.

The support unit 440 has a support plate 442 and a drive shaft 444. The top surface of the support plate 442 is provided in a substantially circular shape and may have a diameter larger than that of the substrate W. A support pin 442a is provided at a central part of the support plate 442 to support the bottom surface of the substrate W, and the support pin 442a is provided to protrude from the support plate 442 such that the substrate W is spaced apart from the support plate 442 by a predetermined distance. A chuck pin 442b is provided at the edge of the support plate 442. The chuck pin 442b is provided to upwardly protrude from the support plate 442, and supports the surface of the substrate W so that the substrate W is not separated from the support unit 440 when the substrate W is rotated. The drive shaft 444 is driven by the driver 446, is connected to a center of the bottom surface of the substrate W, and rotates the support plate 442 based on its central axis.

According to an embodiment, the liquid supply unit 460 may include a nozzle 462. The nozzle 462 may supply a treating liquid to the substrate W. The treating liquid may be a chemical, a rinsing liquid, or an organic solvent. The chemical may be a chemical with strong acid or strong alkaline properties. In addition, the rinsing liquid may be a deionized water. In addition, the organic solvent may be an isopropyl alcohol (IPA). In addition, the liquid supply unit 460 may include a plurality of nozzles 462, and each nozzle 462 may supply a different type of treating liquid. For example, one of the nozzles 462 may supply the chemical, another one of the nozzles 462 may supply the rinsing liquid, and another one of the nozzles 462 may supply the organic solvent. In addition, the controller 30 may control the liquid supply unit 460 to supply the organic solvent from another one of the nozzles 462 to the substrate W after supplying the rinsing liquid from another one of the nozzles 462. Accordingly, the rinsing liquid supplied onto the substrate W may be substituted with an organic solvent having a small surface tension.

The lifting/lowering unit 480 moves the cup 420 in the up/down direction. The relative height between the cup 420 and the substrate W is changed by the up/down movement of the cup 420. As a result, the recollecting containers 422, 424, 426 for recollecting the treating liquid are changed in accordance with the type of liquid supplied to the substrate W, so that the liquids can be recovered separately. Unlike the above description, the cup 420 may be fixedly installed, and the lifting/lowering unit 480 may move the support unit 440 in the up/down direction.

Figure 6:
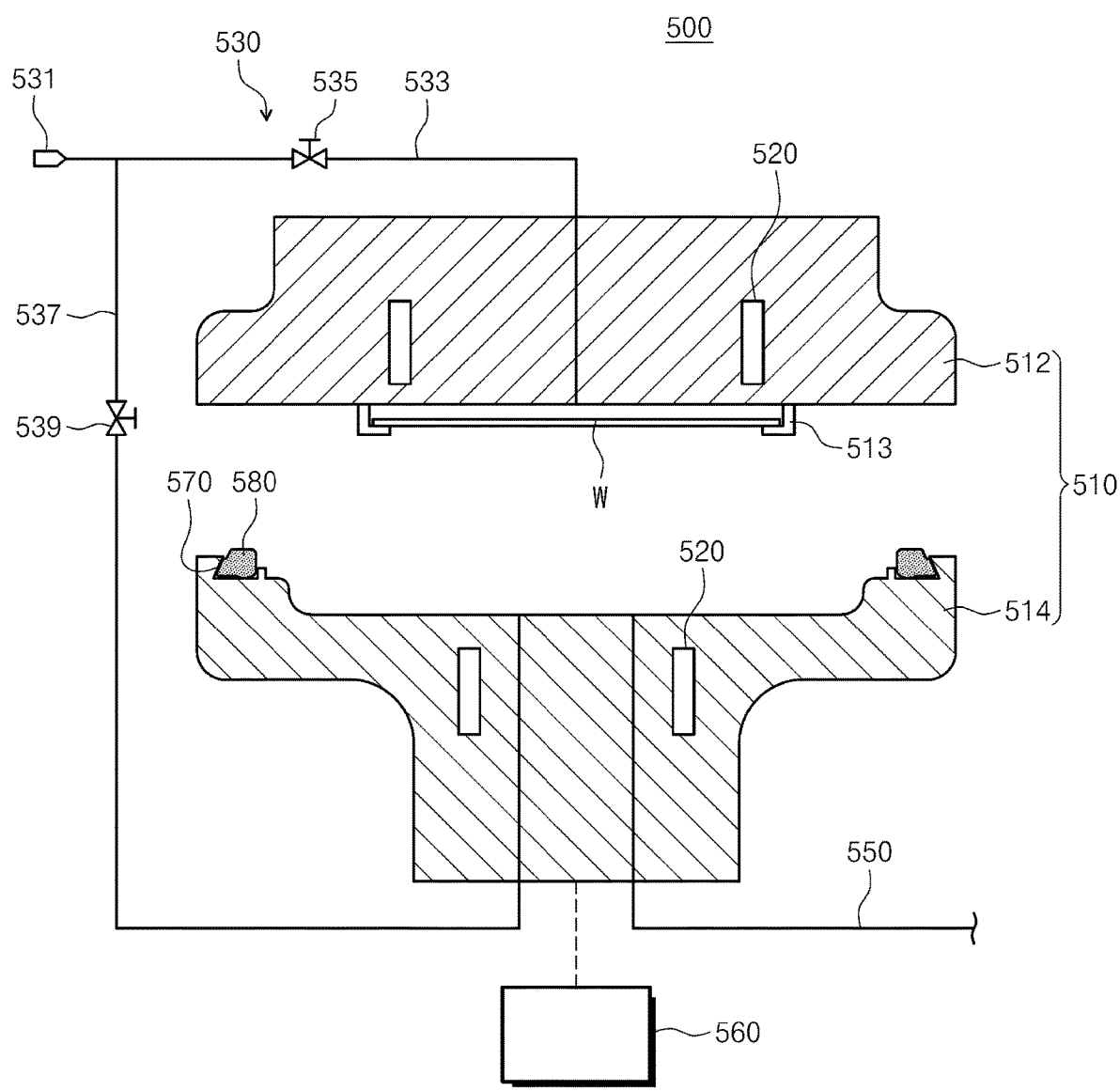
FIG. 6 is a view schematically illustrating an embodiment of a drying chamber of FIG. 4.

FIG. 6 is a view schematically illustrating an embodiment of the drying chamber of FIG. 4. Referring to FIG. 6, the drying chamber 500 according to an embodiment of the inventive concept may remove the treating liquid remaining on the substrate W by using a drying fluid G in a supercritical state. For example, the drying chamber 500 may perform a drying process of removing the organic solvent remaining on the substrate W using a carbon dioxide ($CO_2$) in a supercritical state.

The drying chamber 500 may include a chamber 510, a heating member 520, a fluid supply unit 530, a fluid exhaust line 550, a moving member 560, and a sealing member 580. The chamber 510 may have a treating space in which the substrate W is treated. The chamber 510 may provide a treating space in which the substrate W is treated. The chamber 510 may provide a treating space in which the substrate W is dry-treated by the drying fluid G in the supercritical state.

The chamber 510 may include a top body 512 (an embodiment of a first body) and a bottom body 514 (an embodiment of a second body). The top body 512 and the bottom body 514 may be combined with each other to form a treating space in which the substrate W is treated. The substrate W may be supported in the treating space. For example, the substrate W may be supported by a support member 513 in the treating space. The support member 513 may be configured to support the bottom surface of an edge region of the substrate W. Any one of the top body 512 or the bottom body 514 may be coupled to the moving member 560 to be moved in the up/down direction. For example, the bottom body 514 may be coupled to the moving member 560 to be moved in the up/down direction by the moving member 560. Accordingly, the treating space of the chamber 510 may be selectively sealed. In the above-described example, the bottom body 514 is coupled to the moving member 560 to move in the up/down direction, but the inventive concept is not limited to it. For example, the top body 512 may be coupled to the moving member 560 to move in the up/down direction.

The heating member 520 may heat the drying fluid G supplied to the treating space. The heating member 520 may phase-change the drying fluid G supplied to the treating space into a supercritical state by raising a temperature of the treating space of the chamber 510. In addition, the heating member 520 may raise the temperature of the treating space of the chamber 510 to maintain the supercritical state of the supercritical drying fluid G supplied to the treating space.

In addition, the heating member 520 may be buried in the chamber 510. For example, the heating member 520 may be buried in any one of the top body 512 or the bottom body 514. For example, the heating member 520 may be provided in the top body 512 and the bottom body 514. However, the inventive concept is not limited thereto, and the heating member 520 may be provided at various positions capable of raising the temperature of the treating space. In addition, the heating member 520 may be a heater. However, the inventive concept is not limited thereto, and the heating member 520 may be variously modified into a known device capable of raising the temperature of the treating space.

The fluid supply unit 530 may supply the drying fluid G to the treating space of the chamber 510. The drying fluid G supplied by the fluid supply unit 530 may include a carbon dioxide CO2. The fluid supply unit 530 may include a fluid supply source 531, a first supply line 533, a first supply valve 535, a second supply line 537, and a second supply valve 539.

The fluid supply source 531 may store and/or supply the drying fluid G supplied to the treating space of the chamber 510. The fluid supply source 531 may supply the drying fluid G to the first supply line 533 and/or the second supply line 537. For example, the first supply valve 535 may be installed at the first supply line 533. In addition, the second supply valve 539 may be installed at the second supply line 537. The first supply valve 535 and the second supply valve 539 may be on/off valves. According to an on/off of the first supply valve 535 and the second supply valve 539, the drying fluid G may selectively flow through the first supply line 533 or the second supply line 537.

In the above-described example, the first supply line 533 and the second supply line 537 are connected to one fluid supply source 531, but the inventive concept is not limited thereto. For example, a plurality of fluid supply sources 531 may be provided, the first supply line 533 may be connected to any one of a plurality of fluid supply sources 531, and the second supply line 537 may be connected to another one of the fluid supply sources 531.

In addition, the first supply line 533 may be a top supply line supplying a drying gas from a top portion of the treating space of the chamber 510. For example, the first supply line 533 may supply the drying gas to the treating space of the chamber 510 in a top-to-bottom direction. For example, the first supply line 533 may be connected to the top body 512. In addition, the second supply line 537 may be a bottom supply line supplying the drying gas from a bottom portion of the treating space of the chamber 510. For example, the second supply line 537 may supply the drying gas to the treating space of the chamber 510 in a bottom-to-top direction. For example, the second supply line 537 may be connected to the bottom body 514.

The fluid exhaust line 550 may exhaust the drying fluid G from the treating space of the chamber 510. The fluid exhaust line 550 may be connected to a decompression member (not shown) that provides a decompression to the treating space. The pressure reducing member may be a pump. However, the inventive concept is not limited thereto, and the decompression member may be variously modified into a known device capable of providing decompression to the treating space.

The treating space formed by combining the top body 512 and the bottom body 514 described above may be maintained in a high-pressure state during the treating of the substrate W. Accordingly, the drying chamber 500 may include the sealing member 580 to maintain an airtightness of the treating space formed by the top body 512 and the bottom body 514. The sealing member 580 may be disposed between the top body 512 and the bottom body 514. The sealing member 580 may be inserted into a groove 570 formed in the chamber 510. For example, the groove 570 into which the sealing member 580 is inserted may be formed at the bottom body 514.

Figure 7:
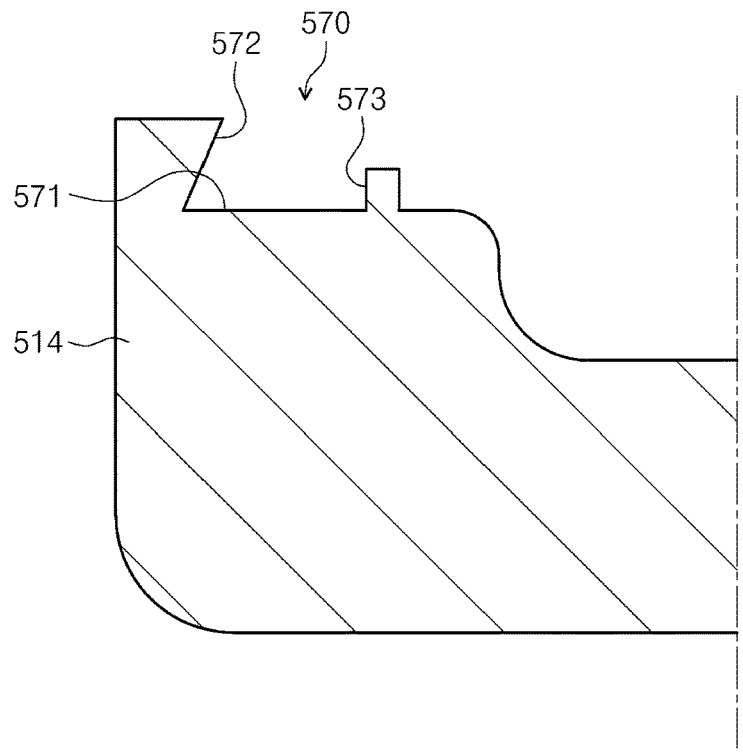
FIG. 7 is a view schematically illustrating a groove formed at the bottom body of FIG. 6.

FIG. 7 is a view schematically illustrating the groove formed at the bottom body of FIG. 6. Referring to FIG. 7, when viewed from above, the groove 570 into which the sealing member 580 is inserted can be formed at the edge region of the bottom body 514. The groove 570 may be formed at a surface facing the bottom surface of the top body 512 described above. The groove 570 may be formed by being indented in a downward direction from the top surface of the bottom body 514. When looking at a cross-section viewed from one direction of the bottom body 514, the groove 570 may include a bottom surface 571, an outer surface 572, and an inner surface 573.

The bottom surface 571 may be a surface on which the sealing member 580 is placed. The bottom surface 571 may be a surface on which the bottom part 581 of the sealing member 580 to be described later is placed. The bottom surface 571 may be provided parallel to a top surface or a bottom surface of the substrate W treated in the treating space of the chamber 510. The bottom surface 571 may be provided parallel to the ground. The bottom surface 571 may be parallel to a direction perpendicular to a direction in which the bottom body 514 moves.

The outer surface 572 may face a surface of the outer part 582 of the sealing member 580 to be described later. The outer surface 572 may be formed at a position relatively far from the treating space of the chamber 510 when compared to the inner surface 573 to be described later. The outer surface 572 may be formed in a direction inclined with respect to the bottom surface 571. For example, the outer surface 572 may have a shape upwardly inclined in a direction from an outer wall of the bottom body 514 toward the treating space of the chamber 510. In addition, the outer surface 572 may be provided parallel to a surface of the outer part 582 of the sealing member 580. The outer surface 572 may be in surface contact with the to be described later. For example, the outer surface 572 may be in surface contact with the outer part 582 of the sealing member 580. In this case, the sealing member 580 may have friction with the outer surface 572 to cause wear on the sealing member 580. Accordingly, the outer surface 572 may be surface polished so that the surface roughness is relatively low. For example, the outer surface 572 may be surface polished so that the surface roughness is relatively lower than that of the inner surface 573 to be described later and the bottom surface 571. For example, the outer surface 572 may be polished by an electrolytic polishing method. For example, the outer surface 572 may be polished such that the surface roughness thereof is Ra 0.7 to Ra 0.8 (e.g., Ra 0.7 or more to Ra 0.8 or less).

The inner surface 573 may face a surface of the inner part 583 of the sealing member 580, which will be described later. The inner surface 573 may be formed at a position relatively close to the treating space of the chamber 510 when compared to the outer surface 572 described above. The inner surface 573 may be formed in a direction perpendicular to the bottom surface 571. For example, the inner surface 573 may be formed in a direction facing upward from the bottom surface 571. In addition, the height of the upper end of the inner surface 573 from the bottom surface 571 may be relatively lower than the height of the upper end of the outer surface 572 from the bottom surface 571.

Figure 8:
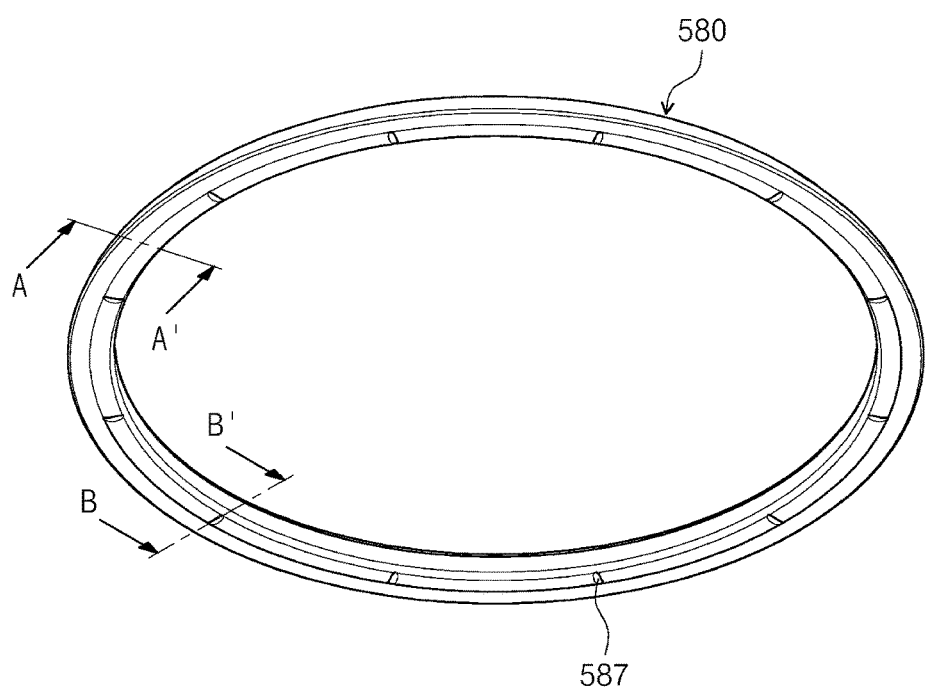
FIG. 8 is a perspective view of the sealing member of FIG. 6 viewed from below.

FIG. 8 is a perspective view of the sealing member of FIG. 6 viewed from below. For example, FIG. 8 may be a perspective view of the sealing member 580 placed in the groove 570 as viewed from below. The sealing member 580 may have a ring shape when viewed from above or below. The sealing member 580 may be formed of a material having an excellent heat resistance and pressure resistance so as to withstand a high-temperature and/or a high-pressure. In addition, the sealing member 580 may be made of a material having a shore hardness of D59 or more.

Figure 9:
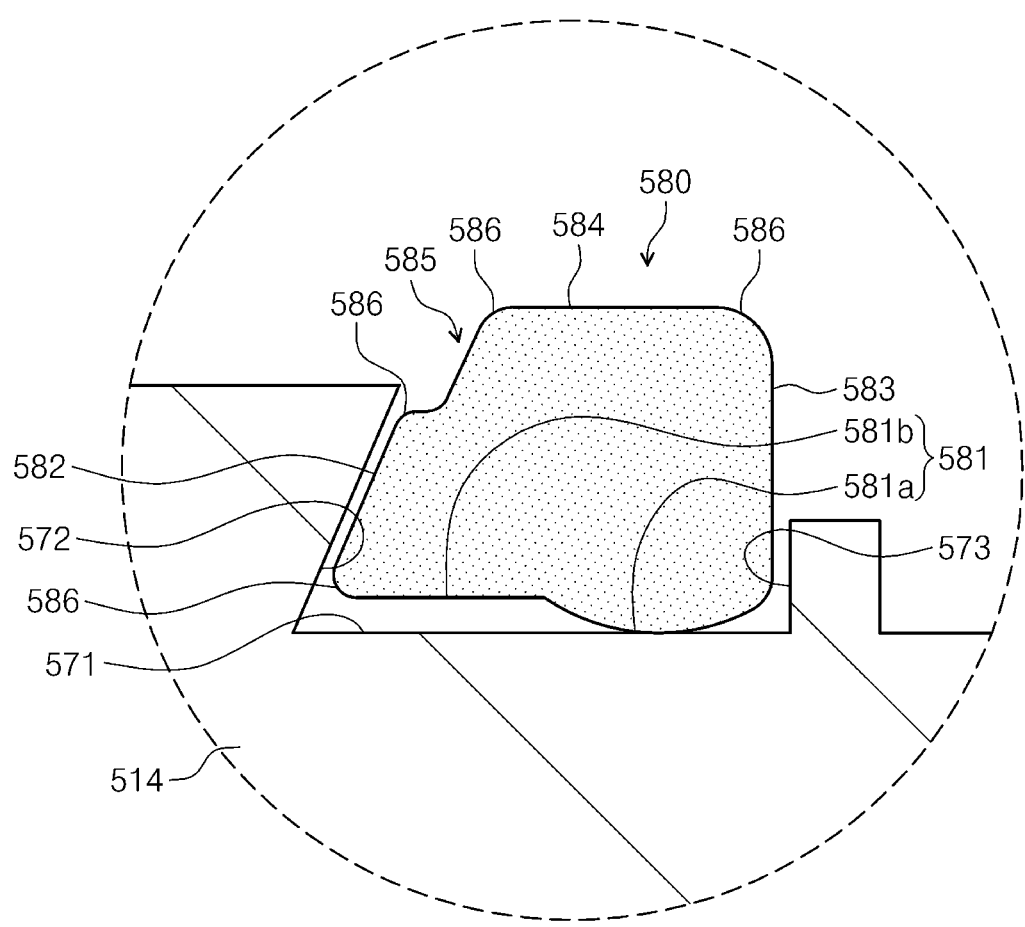
FIG. 9 is a view illustrating the sealing member placed on the groove formed at the bottom body viewed from a section A-A' of FIG. 8.

FIG. 9 is a view illustrating a state in which a sealing member viewed from a cross section A-A' of FIG. 8 is placed in a groove formed in a bottom body. Referring to FIG. 9, the sealing member 580 according to an embodiment of the inventive concept may include a bottom part 581, an outer part 582, an inner part 583, a top part 584, a recessed portion 585, and a chamfered portion 586.

The bottom part 581 may face the bottom surface 571 of the groove 570. The bottom part 581 may include a first curved surface 581a and a second flat surface 581b. The first curved surface 581a may be in line contact with the bottom surface 571 when the sealing member 580 is in an uncompressed state. The first curved surface 581a may have a rounded shape in a direction toward the bottom surface 571 of the groove 570. A surface of the second flat surface 581b may be provided parallel to the bottom surface 571 of the groove 570. The first curved surface 581a may be disposed (or formed) closer to the treating space of the chamber 510 than the second flat surface 581b.

The outer part 582 may have a surface facing the outer surface 572 of the groove 570 described above. The outer part 582 may be formed between the above-described bottom part 581 and a top part 584 to be described later. For example, the outer part 582 may be formed between the second flat surface 581b and the recessed portion 585 to be described later. The outer part 582 may be formed at a position farther from the treating space of the chamber 510 than the inner part 583 to be described later. The surface of the outer part 582 may have a shape inclined with respect to the bottom surface 571 of the groove 570. For example, the surface of the outer part 582 may be provided parallel to the outer surface 572 described above.

In addition, the surface of the outer part 582 may be in contact with the outer surface 572 of the groove 570 when the sealing member 580 is in a compressed state. In this case, the surface of the outer part 582 of the sealing member 580 may be worn by being in contact with the outer surface 572. However, the surface of the outer part 582 according to an embodiment of the inventive concept may have an inclined shape as described above. Accordingly, when the surface of the outer part 582 contacts the outer surface 572, the surface of the outer part 582 may be in surface contact with the outer surface 572. That is, compared to a conventional O-ring 5, the surface of the outer part 582 may be in contact with the outer surface 572 with a relatively large area. That is, when the surface of the outer part 582 is in surface contact with the outer surface 572, the area in which the outer part 582 contacts the outer surface 572 increases, and thus the magnitude of stress transmitted per unit area of the outer part 582 decreases. Accordingly, even when the sealing member 580 is in a compressed state, it is possible to suppress abrasion from occurring in the sealing member 580. In addition, since wear of the sealing member 580 is suppressed, it is possible to reduce or reduce the level of particles generated when the sealing member 580 is worn.

In addition, the surface of the outer part 582 can be polished so that the surface roughness is lower than at least one of the other surfaces of the sealing member 580. For example, the surface of the outer part 582 may be polished so that the surface roughness of the bottom part 581, the inner part 583 to be described later, the top part 584, and the recessed portion 585 is lower than that of the bottom part 581. For example, when the sealing member 580 is processed, various processing steps may be performed. The surface of the outer part 582 may have a relatively greater number of times of grinding treatment performed than the surfaces of the bottom part 581, the inner part 583 to be described later, the top part 584, and the recessed portion 585. For example, a surface of the surface-polished outer part 582 may have a surface roughness of Ra 0.5 or less. The surfaces of the bottom part 581, the inner part 583 to be described later, the top part 584, and the recessed portion 585 may have a surface roughness of about Ra 1.3. That is, the surface roughness of the surface of the outer part 582 may be lower than that of the surfaces of the bottom part 581, the inner part 583 to be described later, the top part 584, and the recessed portion 585. In addition, the difference between the surface roughness of the surface of the outer part 582 and the surface roughness of the outer surface 572 may be less than the difference between the surface roughness of the bottom part 581, the inner part 583 to be described later, the top part 584, and the recessed portion 585. That is, since the difference between the surface roughness of the surface of the outer part 582 and the surface roughness of the outer surface 572 is relatively small, even when the surface of the outer part 582 and the outer surface 572 has friction against each other, wear may be suppressed as much as possible.

The inner part 583 may be formed between the bottom part 581 and the top part 584 to be described later. The inner part 583 may be formed between the first curved surface 581a and a top part 584 to be described later. The surface of the inner part 583 may face the inner surface 573 described above. The surface of the inner part 583 may be provided parallel to the inner surface 573 described above. The inner part 583 may be formed at a position closer to the treating space than the outer part 582.

The top part 584 may be formed between the recessed portion 585 to be described later and the inner part 583 described above. The top part 584 may have a generally flat surface. The surfaces of the top part 584 may face a lower surface of the top body 512. In addition, a level of the surface of the top part 584 may be higher than a level of the upper end of the outer surface 572 and the inner surface 573 described above.

The recessed portion 585 may be formed between the outer part 582 and the top part 584. The recessed portion 585 may have a shape in which a corner portion of the sealing member 580 is generally recessed in an L-shape. For example, any one of the surfaces of the recessed portion 585 may be provided parallel to the surface of the top part 584. A level from the bottom surface 571 of any one of the surfaces of the recessed portion 585 may be lower than a level from the bottom surface 571 of the surface of the top part 584. In addition, the other one of the surfaces of the recessed portion 585 may be provided to be inclined to be parallel to the surface of the outer part 582. The distance to the treating space of the chamber 100 from another surface among the surfaces of the recessed portion 585 may be shorter than the distance to the treating space of the surface of the outer part 582. That is, the recessed portion 585 may be indented from the top part 584 of the sealing member 580 in a downward direction, and may be indented from the outer part 582 of the sealing member 580 in a direction toward the treating space.

Figure 10:
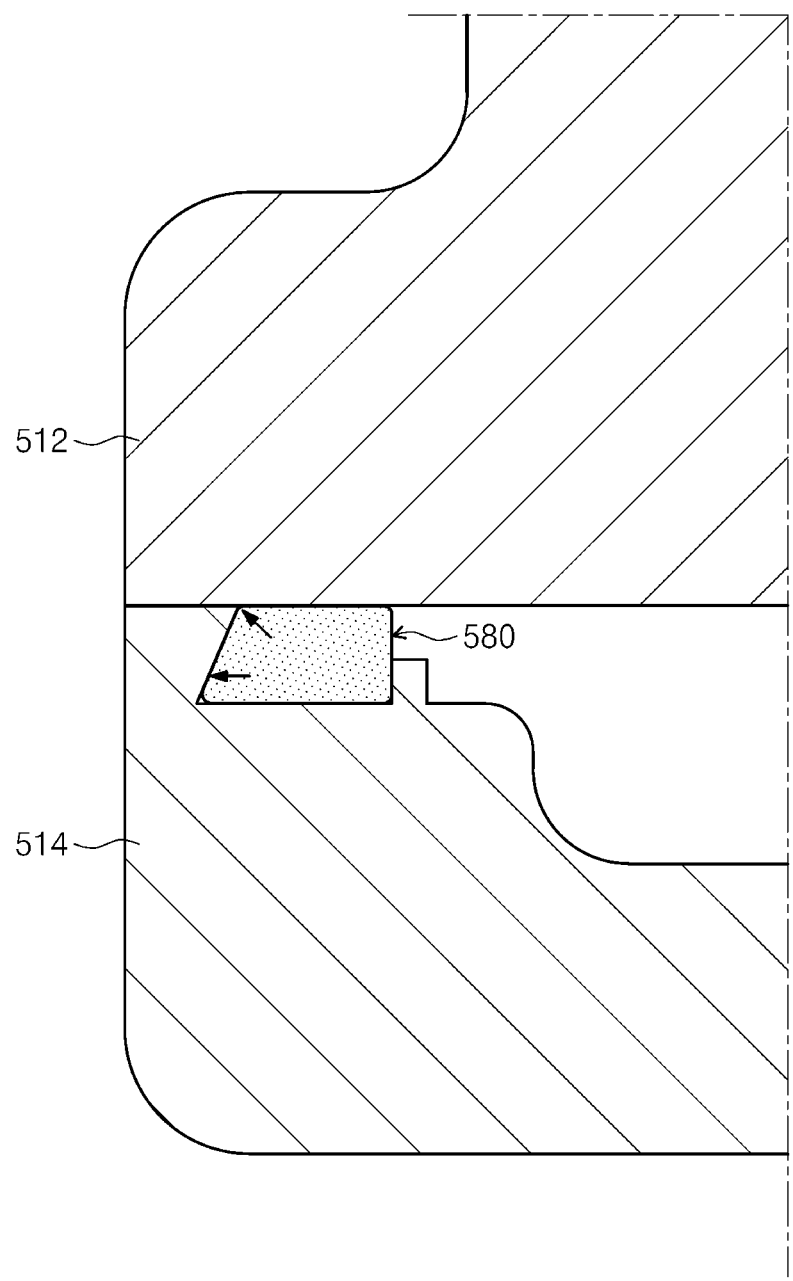
FIG. 10 is a view of the sealing member of FIG. 9 contacting with and compressed by the top chamber.

When the bottom body 514 is upwardly moved and the sealing member 580 contacts the top body 512, the sealing member 580 may be in a compressed state as illustrated in FIG. 10, in which case the sealing member 580 may be compressed toward an outer wall of the top body 512 or the bottom body 514 in the treating space of the chamber 100. A direction in which the sealing member 580 is compressed may include a lateral direction and an upwardly inclined direction. When the sealing member 580 is compressed, some of the parts of the sealing member 580 may be rolled into a space between the top body 512 and the bottom body 514, and in this case, the sealing member 580 may contact the top body 512 and the bottom body 514 to be worn out. However, even if the sealing member 580 is compressed and deformed in shape, the recessed portion 585 in accordance with an embodiment of the inventive concept prevents some of the parts of the sealing member 580 from being separated from the groove 570, hence suppressing wear of the sealing member 580 as much as possible.

Referring back to FIG. 9, the sealing member 580 may further include a chamfered portion 586. A plurality of chamfered portions 586 may be provided. Any one of the chamfered portions 586 may be formed between the second flat surface 581*b* and the outer part 582. The other one of the chamfered portions 586 may be formed between the recessed portion 585 and the top part 584. Another one of the chamfered portions 586 may be formed between the inner part 583 and the top part 584.

Referring back to FIG. 8, at least one groove portion 587 may be formed on a lower surface of the sealing member 580. For example, a plurality of grooves 587 may be provided, and may be formed to be spaced apart from each other at the same interval. For example, the groove portion 587 may be formed by being recessed in a direction from the bottom part 581 of the sealing member 580 toward the top part 584. For example, the groove portion 587 may be formed by being indented in a direction from the first curved surface 581*a* toward the top part 584.

Figure 11:
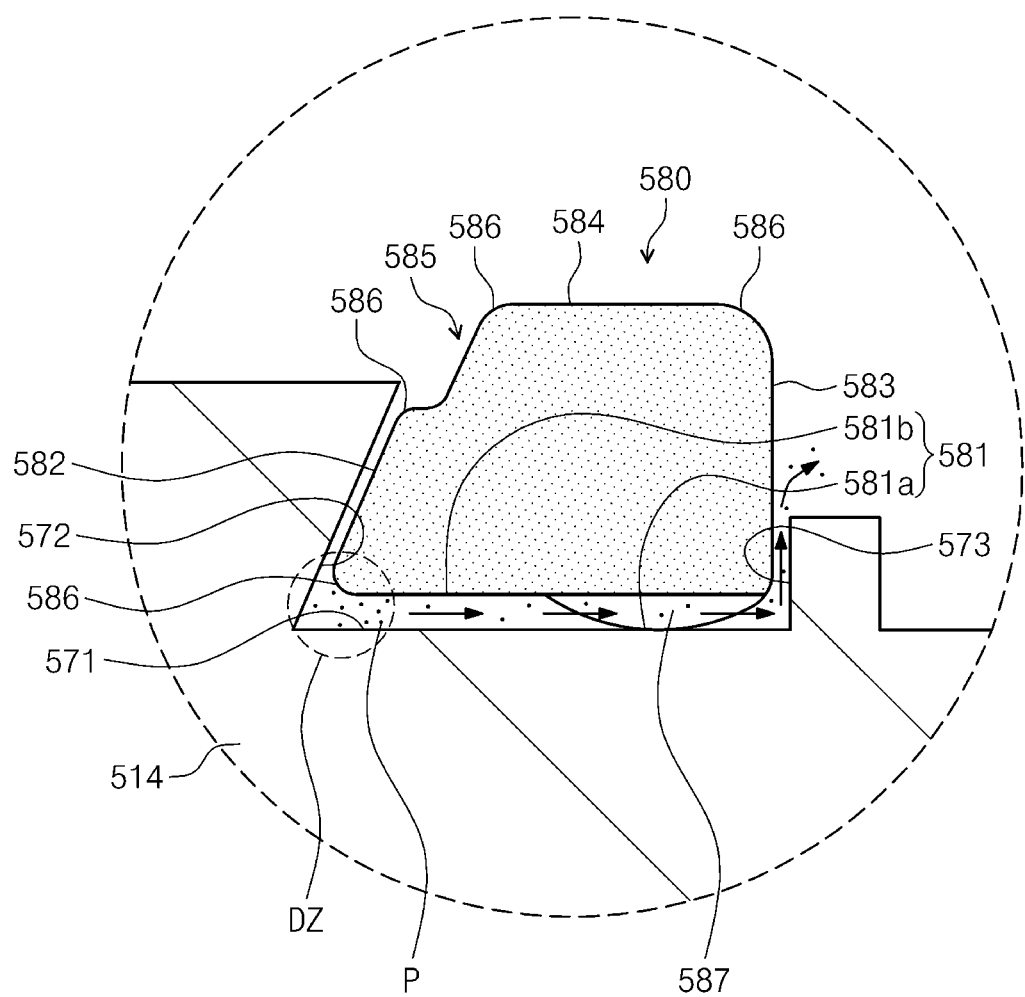
FIG. 11 is a view illustrating the sealing member placed on the groove formed at the bottom body viewed from a section B-B' of FIG. 8.

FIG. 11 is a view illustrating a state in which the sealing member viewed from a cross section B-B' of FIG. 8 is placed in a groove formed at the bottom body. Referring to FIG. 11, surfaces of the sealing member 580 and the groove 570 may form a predetermined space DZ. In the predetermined space DZ formed by the sealing member 580 and the groove 570, impurities P such as particles or process by-products generated when the sealing members 580 are worn may remain. It is possible to prevent a predetermined space DZ of the sealing member 580 according to an embodiment of the inventive concept from becoming a dead zone. For example, the impurities P remaining in the predetermined space DZ may fluidly communicate with the treating space of the chamber 510 through the groove 587. Accordingly, the impurities P may be discharged to the outside of the drying chamber 500 through a fluid exhaust line 550 connected to the chamber 510.

Figure 12:
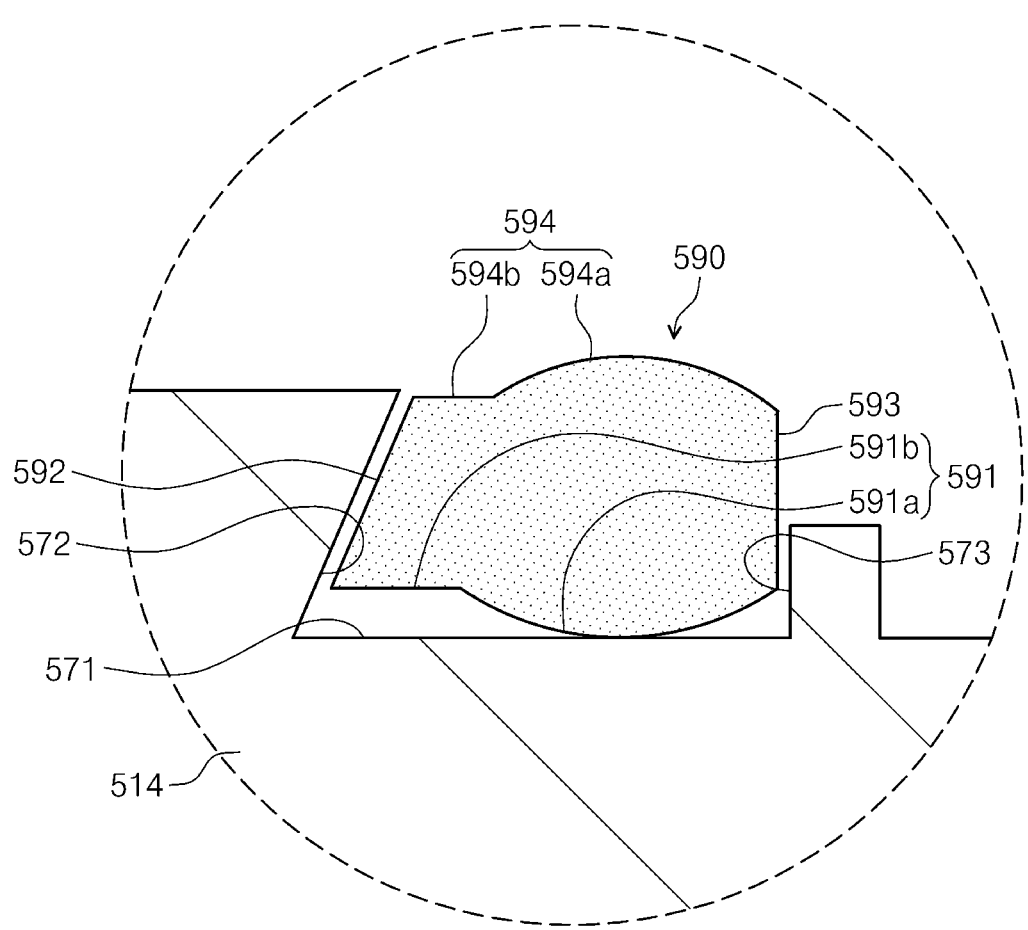
FIG. 12 is a view illustrating the sealing member placed on the groove formed at the bottom body according to an embodiment of the inventive concept.

FIG. 12 is a view illustrating a state in which the sealing member according to another embodiment of the inventive concept is placed in the groove formed in the bottom body. The sealing member 590 according to another embodiment of the inventive concept may have a substantially similar shape to the sealing member 580 according to an embodiment described above. For example, the sealing member 590 may include a bottom part 591, an outer part 592, an inner part 593, and a top part 594. The bottom part 591 may include a first curved surface 591*a* and a second flat surface 591*b* similar to the bottom part 581 described above. The outer part 592 may be surface polished similar to the outer part 582 described above. In addition, the top part 594 may include a first curved surface 594*a* and a second flat surface 594*b*. The first curved surface 594*a* may be formed at a position adjacent to the treating space of the chamber 510. The first curved surface 594*a* may have a rounded shape in an upward direction. The second flat surface 594*b* may be formed at a position relatively far from the treating space of the chamber 510. The surface of the second flat surface 594*b* may have a flat shape.

Figure 13:
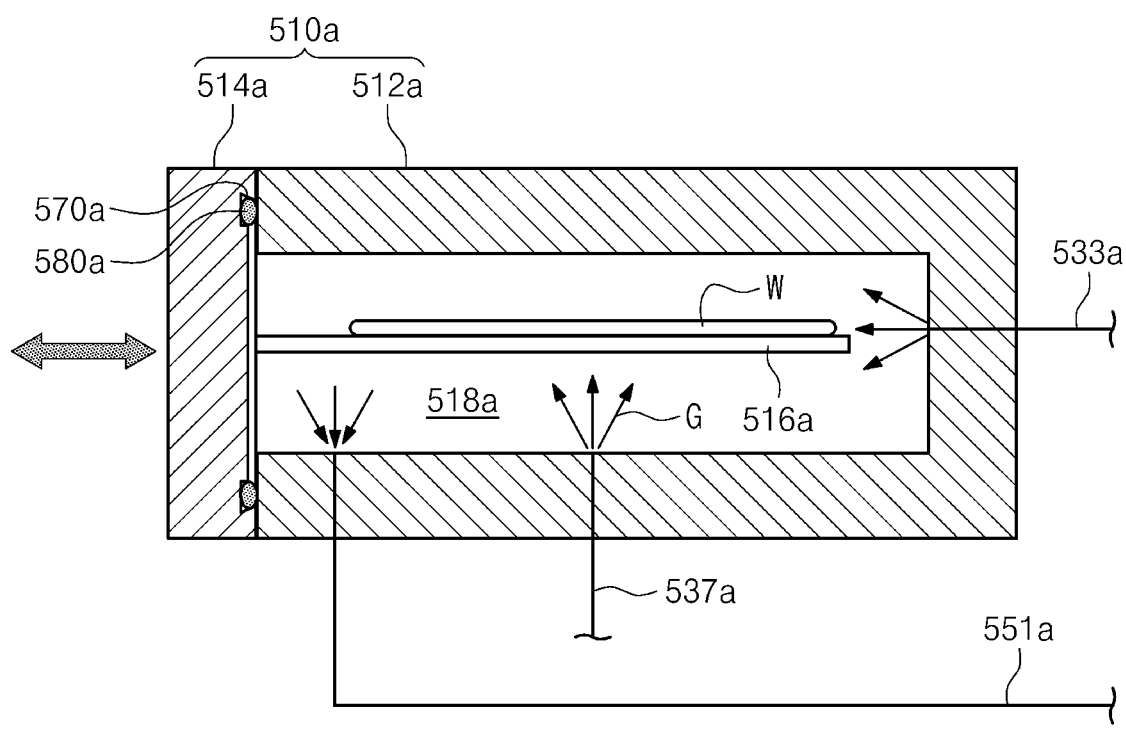
FIG. 13 is a view schematically illustrating the drying chamber according to another embodiment of the inventive concept.

FIG. 13 is a view schematically illustrating a drying chamber according to another embodiment of the inventive concept. In the above-described example, the chamber 510 includes a top body 512 and a bottom body 514, but is not limited thereto. For example, as illustrated in FIG. 13, the chamber 510*a* may include a base body 512*a* and a door body 514*a*. The base body 512*a* and the door body 511*a* may be combined with each other to form a treating space 518*a*. The base body 512*a* may have a container shape open in a side direction, and the door body 514*a* may be moved in a lateral direction to selectively open and close the treating space 518*a*. A groove 570*a* may be formed in the door body 514*a*. The groove 570*a* may have the same or similar shape as the groove 570 described above. In addition, a sealing member 580*a* may be inserted into the groove 570. The sealing member 580*a* may have the same or similar shape as the sealing member 580 according to the above-described embodiment or the sealing member 590 according to another embodiment described above. In addition, a support plate 516*a* may be coupled to the door body 514*a*, and a substrate W may be supported to the support plate 516*a*.

In addition, the first supply line 533*a* may supply the drying fluid G from the surface of the substrate W supported by the support plate 516*a*. In addition, the second supply line 537*a* may supply a drying fluid under the substrate W. In addition, the main exhaust line 551*a* may exhaust the inner space 518*a* under the substrate W. Other configurations may be the same/similar to those of the fluid supply unit 530 and the fluid exhaust line 550 described above.

In the above-described example, the sealing members 580 and 590 are inserted into the groove 570 formed in the chamber 510 for drying the substrate W using the supercritical fluid, but the inventive concept is not limited thereto. For example, the sealing member 580 and 590 may also be applied to a groove formed in various chambers for treating the substrate W using various treating fluids other than supercritical fluids.

Also, in the above-described example, the sealing members 580 and 590 are provided to the groove 570 formed in the bottom body 514, but this inventive concept is not limited thereto. For example, the sealing members 580 and 590 may be equally or similarly applied to components of various substrate treating apparatuses having a driving environment.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A sealing member for use in sealing a chamber for treating a substrate, the sealing member inserted in a groove formed in the chamber, and the sealing member comprising:
   a bottom part having a first flat surface and a first curved surface, wherein the first curved surface is connected to the first flat surface;
   a top part opposite the bottom part, wherein the top part has a second flat surface parallel to the first flat surface of the bottom part and a rounded corner that is disposed at a corner of the sealing member and that is connected to the second flat surface;

an inner part connecting the first curved surface of the bottom part to the rounded corner of the top part;

an outer part opposite the inner part and having a first inclined surface connecting the first flat surface of the bottom part to the second flat surface the top part; and a recessed portion between the top part and the outer part, wherein the recessed portion has a third flat surface that is parallel to the second flat surface of the top part, and a second inclined surface that is parallel to the first inclined surface of the outer part.

2. The sealing member of claim 1,
wherein a level of the third flat surface of the recessed portion from a bottom of the groove is lower than a level of the second flat surface of the top part from the bottom of the groove.

3. The sealing member of claim 1,
wherein the second inclined surface of the recessed portion is closer to a surface of the inner part than the first inclined surface of the outer part.

4. The sealing member of claim 1,
wherein the first inclined surface of the outer part is inclined toward the inner part with respect to the first flat surface of the bottom part.

5. The sealing member of claim 4,
wherein the outer part contacts a surface of the groove when the sealing member is compressed, and wherein the surface of the outer part has a surface roughness that is lower than a surface roughness of at least one of the other parts of the sealing member.

6. The sealing member of claim 5,
wherein the first inclined surface of the outer part has the surface roughness of Ra 0.5 or lower.

7. The sealing member of claim 1,
wherein the bottom part comprises:
a first bottom portion having a round shape facing a bottom surface of the groove; and
a second bottom portion having the first flat surface parallel to the bottom surface of the groove.

8. The sealing member of claim 7,
wherein the first bottom portion is adjacent to the inner part.

9. The sealing member of claim 1, further comprising:
at least one groove portion upwardly recessed from the bottom part.

* * * * *